United States Patent [19]

Shanfield et al.

[11] Patent Number: 5,223,458
[45] Date of Patent: Jun. 29, 1993

[54] METHOD OF MANUFACTURING A III-V SEMICONDUCTOR DEVICE USING A SELF-BIASED SUBSTRATE AND A PLASMA CONTAINING AN ELECTRONEGATIVE SPECIES

[75] Inventors: Stanley R. Shanfield, West Newton, Mass.; Bharat Patel, Nashua, N.H.; Hermann Statz, Wayland, Mass.

[73] Assignee: Raytheon Company, Lexington, Mass.

[21] Appl. No.: 954,607

[22] Filed: Sep. 30, 1992

Related U.S. Application Data

[63] Continuation of Ser. No. 629,316, Dec. 18, 1990, abandoned.

[51] Int. Cl.$^5$ .............. H01L 21/00; H01L 21/02; H01L 21/04; H01L 21/18
[52] U.S. Cl. .................. 437/225; 437/235; 437/243; 437/244; 437/912; 148/DIG. 65
[58] Field of Search ............... 437/225, 228, 233, 234, 437/235, 236, 243, 244, 912, 946, 980; 148/DIG. 56, DIG. 65, DIG. 113, DIG. 118; 204/164

[56] References Cited

U.S. PATENT DOCUMENTS

| | | | |
|---|---|---|---|
| 4,062,747 | 12/1977 | Chang et al. | 204/164 |
| 4,116,722 | 9/1978 | Kamei et al. | 437/228 |
| 4,194,927 | 3/1980 | Takagi et al. | 437/244 |
| 4,226,667 | 10/1980 | Logan | 437/228 |
| 4,297,176 | 10/1981 | Hannah et al. | 437/236 |
| 4,448,633 | 5/1984 | Shuskus | 437/235 |
| 4,645,683 | 2/1987 | Gourrier et al. | 437/241 |
| 4,684,541 | 8/1987 | Franciosi | 437/225 |
| 4,843,450 | 6/1989 | Kirchner et al. | |
| 4,859,253 | 8/1989 | Buchanan et al. | 437/235 |
| 4,871,692 | 10/1989 | Lee et al. | 437/225 |
| 4,990,984 | 2/1991 | Misu | |
| 5,011,787 | 4/1991 | Jeuch | |
| 5,021,365 | 6/1991 | Kirchner et al. | |

FOREIGN PATENT DOCUMENTS 0078171 4/1986 Japan .

OTHER PUBLICATIONS

Ghandhi, S., VLSI Fabrication Principles, Wiley & Sons, 1983, pp. 421–424, 427–430.
Yamasaki, Anodic Oxidation of GaAs Using Oxygen Plasma, Jap. J. of Appl. Phys., vol. 17, Suppl. 17-1, 1978, pp. 321–326.
Tenedorio, Effects of $Si_3N_4$, SiO, and Polyimide Surface Passivations on GaAs MESFET Amplifier RF Stability, IEEE Electron Dev. Letters, vol. EDL-5, No. 6, Jun. 1984, pp. 199–202.
Clark, Improvements in GaAs/Plasma-Deposited Silicon Nitride Interface Quality by Predeposition GaAs Surface Treatment and Postdeposition Annealing, J. Vac. Sci. Technol., 21(2), Jul. 1982, pp. 453–456.
Callegari, Unpinned Gallium Oxide/GaAs Interface by Hydrogen and Nitrogen Surface Plasma Treatment, Appl. Phys. Lett. 54(4), Jan. 1989, pp. 332–334.
S. M. Sze, VLSI Technology, Second Edition, McGraw-Hill Book Company, 1988, pp. 266–267, 341–342, and 491–492.
K. Yamasaki and T. Sugano, "Mechanism of Oxide Film Growth on GaAs by Plasma Anodization," J. Vac. Sci. Technol., 17(5), Sep./Oct. 1980, pp. 959–963.
R. K. Ahrenkiel and D. J. Dunlavy, "The Density of States at GaAs/Native Oxide Interfaces," Solid-State Electronics vol. 27, No. 5, pp. 485–489, 1984.

(List continued on next page.)

Primary Examiner—Brian E. Hearn
Assistant Examiner—B. Everhart
Attorney, Agent, or Firm—Richard M. Sharkansky

[57] ABSTRACT

A passivation technique which significantly reduces degradation in reverse breakdown voltage characteristics usually introduced by passivation of active regions of field effect transistors is described. The technique uses a surface treatment in a plasma to introduce into the surface an electro-negative species to maintain negative surface potential of the surface subsequent to encapsulation by the passivation material.

21 Claims, 2 Drawing Sheets

OTHER PUBLICATIONS

F. I. Hshieh, K. N. Bhat, S. K. Ghandhi, and J. M. Borrego, "Electrical Characterization of Plasma-Grown Oxide on Gallium Arsenide," J. Appl. Phys. 57(10), May 15, 1985, pp. 4657–4662.

S. H. Wemple, M. L. Steinberger, W. O. Schlosser, "Relationship Between Power Added Efficiency and Gate-Drain Avalanche in GaAs M.E.S.F.E.T.s", Bell Laboratories, May 7, 1980, pp. 459–460.

Y. Yamane, Y. Ishii, and T. Mizutani, "Degradation-Free P-CVD SiN Deposition on GaAs FETs," Japanese Journal of Applied Physics, vol. 22, No. 6, Jun., 1983, pp. L350–L352.

T. M. Barton and P. H. Ladbrooke, "The Role of the Device Surface in the High Voltage Behaviour of the GaAs MESFET," Solid-State Electronics, vol. 29, No. 8, pp. 807–813, 1986.

H. Mizuta, K. Yamaguchi, and S. Takahashi, "Surface Potential Effect on Gate-Drain Avalanche Breakdown in GaAs MESFET's," IEEE Transactions on Electron Devs, vol. ED-34, No. 10, Oct. 87, 2027–2033.

METHOD OF MANUFACTURING A III-V SEMICONDUCTOR DEVICE USING A SELF-BIASED SUBSTRATE AND A PLASMA CONTAINING AN ELECTRONEGATIVE SPECIES

This application is a continuation of U.S. patent application Ser. No. 629,316 filed Dec. 18, 1990, now abandoned.

BACKGROUND OF THE INVENTION

This invention relates generally to semiconductor devices and, more particularly, to passivation of semiconductor devices.

As is known in the art, it is common to encapsulate a semiconductor device in a inert material to isolate the semiconductor device from its immediate environment. The environment which may contain oxygen, water, etc. may modify the electrical characteristics of the device if not so isolated.

In particular, for microwave semiconductor devices, such as metal semiconductor field effect transistors (MESFETS) comprised of Group III-V materials such as gallium arsenide it is generally known to deposit a passivating material such as silicon nitride, silicon monoxide, silicon dioxide, silicon oxynitride, or polymide over the surface of the device and to thus isolate exposed surfaces of the gallium arsenide from an external environment.

Silicon nitride is amongst the most widely used material for passivation layers on gallium arsenide since it is extremely chemically stable and has excellent barrier properties. Moreover, the silicon nitride can also provide a dielectric for metal insulator metal (MIM) capacitors commonly employed in monolithic microwave integrated circuits, for example. The most common approach used to deposit silicon nitride for MESFET applications, whether the MESFET is a discrete device or incorporated as part of a monolithic microwave integrated circuit, is to use a plasma enhanced chemical vapor deposition technique in which a plasma of reactant gases which contain silicon and nitrogen is provided at a temperature in the range of approximately 150° C. to 300° C. The gases are reacted within this temperature range to deposit silicon nitride on the semiconductor substrate.

Although silicon nitride films, as well as many of the other passivation films have highly desirable characteristics as passivants they also have several drawbacks. Amongst these drawbacks are that silicon nitride films generally change threshold voltages of field effect transistors. That is, the voltage in which the channel of the transistor is "pinched off" may vary after silicon nitride deposition. It has been observed that surface damage from energetic ion bombardment provided during the plasma enhanced deposition degrades performance of the transistor.

A problem which is also observed in MESFETS after encapsulation by a passivation material including the aforementioned silicon nitride is a undesirable reduction in the reverse breakdown voltage between the gate and drain electrode as well as between the drain and source electrodes. This effect is observed with all types of encapsulation materials commonly used. The amount of reduction in reverse breakdown voltage varies widely from one wafer to a subsequent wafer resulting in large variations in final breakdown voltage characteristics. This variation makes specification of individual devices difficult to provide. Moreover, decreases in reverse breakdown voltage provides concomitant decreases in power capabilities. In addition to the aforementioned reduced reverse breakdown voltage, passivation materials, such as silicon nitride can occasionally change other MESFET characteristics. One common electrical characteristic which is changed by the presence of the passivation is leakage current between the gate and drain electrodes when operated under reverse bias conditions. This characteristic is often unstable and can change in magnitude with operation of the transistor. In particular, increases in leakage current often occur after several minutes of operation of the device under a high gate current condition.

SUMMARY OF THE INVENTION

In accordance with the present invention, a method of preparing a semiconductor surface carrying a semiconductor device to receive a passivation layer comprises the steps of disposing said surface in a plasma containing an electro-negative species having a voltage potential bias between said plasma and surface of greater than zero volts to introduce such electro-negative species into a surface portion of said semiconductor surface and depositing said passivation layer over at least said surface portion of said semiconductor surface having therein the electro-negative species. With such an arrangement, by disposing the surface in the plasma at a bias of greater than zero volts the electro-negative species will be incorporated into thicker surface portions of said semiconductor surface providing a relatively high negative surface potential on the exposed surface. It is believed that passivating a semiconductor surface such as gallium arsenide with a material such as silicon nitride, silicon monoxide, silicon dioxide, silicon oxynitride, polymides, and so forth removes negative charge from said surface. Removing negative charge from the semiconductor surface is believed to have an effect in reducing the reverse breakdown voltage characteristic between electrodes of said device when incorporating such a passivation layer. By incorporating an electro-negative species into the semiconductor surface, the negative charge in the surface can be maintained after passivation, thus minimizing reductions in reverse breakdown voltage.

In accordance with a further aspect of the present invention, a field effect transistor includes a substrate supporting an active layer comprising a Group III-V semiconductor material having a doped semiconductor layer with source and drain electrodes disposed over said layer and a gate electrode disposed in Schottky barrier contact to said layer between said source and drain electrodes. A surface portion of said active layer disposed between source and drain electrodes includes an electro-negative species incorporated into said surface to a thickness of greater than 35 Å. A layer of passivation material is then disposed over at least said surface layer portion of said active layer to passivate said active layer. With such an arrangement, by providing the relatively thick surface portion incorporating the electro-negative species, the surface potential of the exposed Group III-V material is stabilized such that when a passivation layer is disposed over said surface layer portion, the passivation layer will not make the surface potential of the exposed layer significantly more positive. This provides passivated field effect transistors having a reverse breakdown voltage characteristic comparable to that of the transistor prior to receiving the passivation layer.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
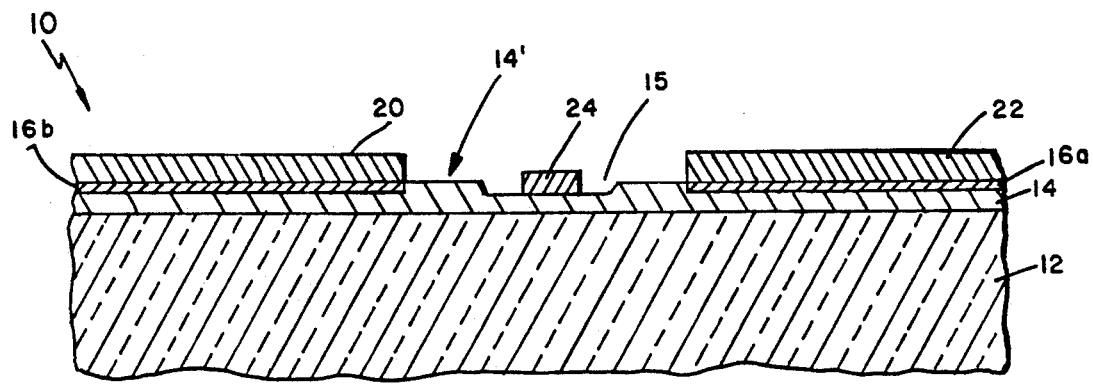
FIGS. 1-3 are a series of cross-sectional views showing the steps in providing a passivation layer over a metal semiconductor field effect transistor having a prepared exposed surface layer portion in accordance with the present invention.
Figure 2:
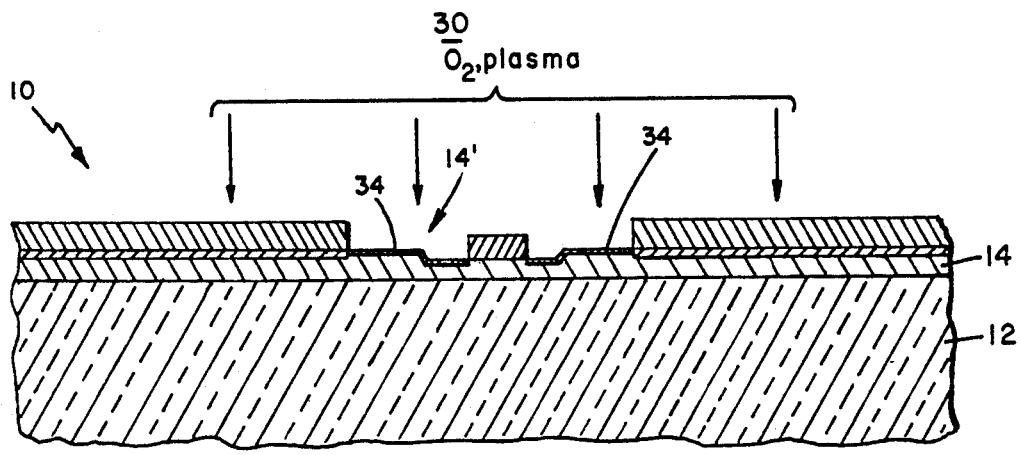
Figure 3:
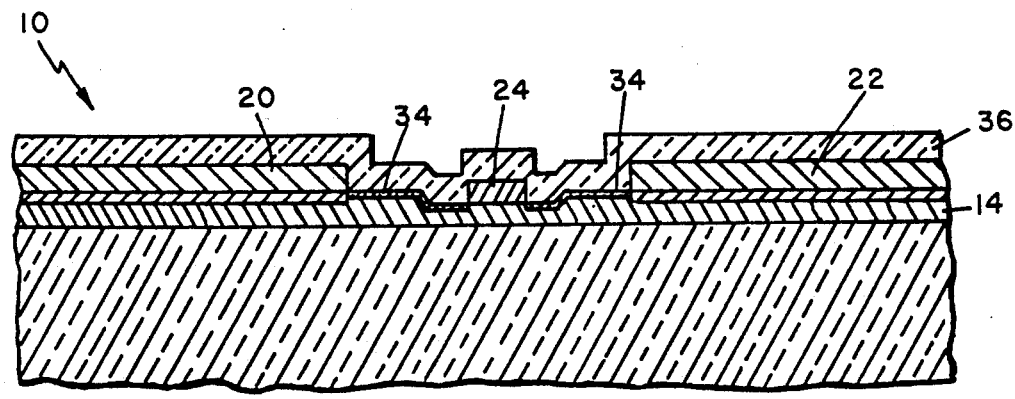

Referring now to FIGS. 1-3 steps in the fabrication of a field effect transistor having a passivation layer disposed thereover will be described.

Referring now to FIG. 1, a metal semiconductor field effect transistor 10 (MESFET) is shown supported over a semi-insulating substrate 12 here comprised of gallium arsenide or other suitable Group III-V materials. Although the invention to be described herein uses a MESFET as the field effect transistor, it is clear that other semiconductor devices, such as heterojunction bipolar transistors, as well as other field effect transistors such as high electron mobility transistors and pseudomorphic high electron mobility transistors, for example, may also be used. Furthermore, other semiconductor materials such as other Group III-V materials may also be used in the practice of the invention.

Returning to discussion of FIG. 1, the MESFET 10 is shown supported over a substrate 12 comprised of here semi-insulating gallium arsenide. The MESFET 10 includes an active layer 14 comprised of doped gallium arsenide which here is provided by implanting dopant ions such as energized silicon ions into surfaces of the substrate 12 and activating said ions by annealing out lattice damage caused by the implantation and thus activating the implanted species as is commonly employed in the art. Active layer 14 is typically doped to a concentration in the range of $1 \times 10^{16}$ at/cc to $5 \times 10^{17}$ at/cc. Alternatively, active layer 14 may be provided by other techniques such as etching epitaxially grown layers provided by molecular beam epitaxy, metal organic chemical vapor deposition epitaxy, as well as other techniques. Disposed over layer 14 are an optional pair of contact layers 16a, 16b comprised of more highly doped semiconductor material typically doped to a concentration of $2 \times 10^{17}$ atoms/cc and higher. Disposed over here the optional contact layers 16a, 16b or active layer 14 when layers 16a, 16b are omitted are respectively source and drain electrodes 22 and 20. Source and drain electrodes 22,20 are comprised of any conventional metalization scheme provided by any conventional technique which when disposed over the optimal contact layers 16a, 16b or active layer 14 provide low resistivity ohmic-type contacts thereto as is commonly known in the art. Here, contact layers 16a, 16b are formed by pocket implants into portions of active layer 14 as is also known by one of ordinary skill in the art. Not shown, but which would also be provided with such a circuit, are isolation regions disposed off of the active regions of the field effect transistor which would render unused portions of layer 16a, 16b and underlying layer 14 semi-insulating. Such regions can be provided, for example, by implantation of species such as boron or oxygen as is commonly known in the art. A recessed channel 15 is here provided in the layer 14. The channel 15 is selectively etched to control the pinch off voltage of the channel 15 between the source and drain electrodes 22, 20 as is commonly employed for MESFET transistors. A gate electrode 24 is also disposed in the recessed channel portion 15 and is comprised of a Schottky barrier forming metal and thus provides a Schottky barrier contact to the active layer 14. Thus, after formation of source, drain, and gate electrodes, portions 14' of active layer 14 are exposed or uncovered. It is within this region where passivation is critical and in which adverse effects on transistor characteristics due to the presence of the passivation are generally provided.

The aforementioned is a general description of a metal semiconductor field effect transistor having a single gate finger disposed between a pair of source and drain regions. Obviously, for other applications, a plurality of cells as that one described above could also be used.

Referring now to FIG. 2, the transistor 10 supported on substrate 12 is disposed within a plasma flux 30 containing a highly electro-negative species, here $O_2$. Generally, at these temperatures, the device is maintained in the $O_2$ plasma for approximately 15 minutes at least and generally in the range of at least 30 minutes to 45 minutes. Other highly electro-negative species, which alternatively may be employed, include fluorine, chlorine, nitrogen, and sulphur. In the presence of here the $O_2$ plasma, exposed surface portions 14' of the exposed active region 14 are converted into a thin surface layer 34 incorporating the specie. Thus in the described example, it is believed that an oxide or oxides of gallium and arsenic are formed during the plasma treatment on all exposed portions 14' of the semiconductor material, here GaAs.

Preferably, prior to the FET 10 being disposed in the plasma exposed active layer portions 14' in particular of the FET 10 are cleaned using an ammonium hydroxide treatment to remove any residual contamination associated with prior processing steps. For example, one of the last steps to be performed in fabricating the transistor 10 is the formation of the gate electrode 24. At some point in the processing after the gate electrode 24 is provided, a resist layer (not shown) which was used to pattern the region for the gate electrode 24 is removed from the surface of the substrate 10 and, in particular, from the surface of the exposed portions 14' of the active region 14. Generally, these exposed portions are removed by an oxygen plasma treatment in which the device is placed in an oxygen plasma apparatus (not shown) for up to 3 or 4 minutes. A small irregular oxide maybe formed as a result of this exposure. In general, this layer, if present, would be 15 Å or less thick and have a somewhat irregular thickness.

Preferably, it is desirable to remove this oxide and to provide a oxide of a uniform thickness of greater than about 25 Å prior to deposition of a passivation layer as will be described. Thus, the aforementioned cleaning step is preferred to be used prior to disposing the field effect transistor in the oxygen plasma treatment described above.

Nevertheless whether cleaned or not, the transistor 10 is treated for a period of approximately at least 15 minutes preferable 35 to 45 minutes or more and, here 45 minutes by exposure to a pure oxygen plasma environment to grow an oxide having a uniform thickness typically between 25 Å and 100 Å as inferred from ellipsometer measurements of a surface reflection angle ($\Delta$). The ellipsometer measurement technique measures the phase difference of a beam of light introduced by reflection of the beam from a surface of the wafer. In the instant case, for a completely oxide-free gallium arsenide surface, the phase angle $\Delta$ will have a value of approximately 168°. For devices in accordance with the present invention, the phase angle $\Delta$ will have a value generally less than about 162°.

The oxygen plasma is provided in a conventional barrel plasma reactor (i.e. etching system). A typical set of conditions are that the reactor is at an internal pressure of 1.7 torr, oxygen flow is at a rate of 50 SCCM, and RF power of 500 watts at 13.56 megahertz is provided. It is generally desired to have the deliberately grown oxide layer 36 thicker than that which may be provided by a few minutes of growth of an oxide layer, such as would accidentally occur in an $O_2$ plasma removal of a photoresist layer from the active layer 14 after formation of the gate electrode 24. In general, the plasma deposition should occur over a period of time of at least 20 minutes and preferably up to 45 minutes or more with a typical time of 35 to 45 minutes being preferred. This time period would provide oxide containing regions of the order of 25 Å to 35 Å in thickness.

An alternative technique to provide the incorporated electro-negative species into the surface portion 14' is to dispose the transistor 10 into a reactive ion etcher containing a plasma of the selected electro-negative species. This technique would be used, in particular, to provide a highly uniform thickness of the oxide containing surface and, moreover, provide thicker layers, in particular, thicker than about 40 Å up to 100 Å and more. Typical growth conditions for the species $O_2$ would be an $O_2$ flow rate of 95 sccm $O_2$ at 100 mTorr internal pressure, at an input power of 200 watts, and a self-bias between the plasma and the surface of the substrate of greater than zero volts and preferably 50 to 80 volts with the substrate surface being more negative than the plasma. A typical duration would be 30 minutes. This technique would permit the growth of thicker layers incorporating the electronegative species such as $O_2$ as in the illustrative example. Generally, oxide containing films 34 of 35 Å up to 100 Å or more would be expected by the above stated typical conditions. A generally preferred typical thickness would be 75Å.

In the first method mentioned above, the conventional barrel plasma reactor, a relatively high pressure plasma is provided in the barrel and oxidizes the GaAs surface to a maximum depth of around 30 to 35 Å. No bias potential can be applied between the plasma and the surface of the substrate.

With the reactive ion etching system, a relatively low pressure planar plasma discharge is provided between a pair of planar electrodes within which the GaAs substrate is disposed. A bias potential between the upper electrode of the pair of electrodes and the substrate is provided. This bias potential provides an electric field gradient which is believed to increase the oxidation reaction driving force further than is possible in the barrel plasma approach. With the latter approach, oxide region thicknesses of up to about 75 Å and higher are possible. Since the wafer is disposed between a pair of spaced parallel electrodes in the reactive ion reactor system, a more uniform thickness in the oxide surface layer is also provided.

Referring now to FIG. 3, after the $O_2$ surface treatment, the treated portions 34 of active layer 14 are encapsulated by a layer of passivation material 36. Here the passivation layer 36 also extends over source and drain electrodes 20 and 22, as shown. In particular, the interfacial region (i.e. treated region 34) between the active layer 14 and the passivation layer 36 is comprised of a thin oxide containing surface layer portion. That is layer 34 is comprised of GaAs as well as oxides of Ga and As. It is believed that the presence of oxygen in the thin oxide layer 34 between source and gate electrodes and drain and gate electrodes improves the reverse drain-gate as well as drain-source breakdown voltage characteristics of the FET. Disruption in bonds at the surface of the exposed GaAs provides such surface with a negative surface potential. The negative surface potential of the GaAs prior to passivation plays a role in reverse breakdown voltage. Generally, after passivation, the negative charge on the surface of the passivated active layer is reduced, providing a concomitant reduction in the reverse breakdown voltage. The presence of oxygen or strongly electro-negative elements as in the present invention maintains a relatively high negative surface potential at regions 34 even after passivation. Thus, FET 10' will have relatively high reverse breakdown voltage characteristics compared to a FET which was passivated without the surface 34.

Here, the passivation layer 36 is provided over the wafer of transistors represented by the field effect transistor 10 of FIG. 2 by placing the wafer in a plasma deposition system (not shown). Typical conditions for that plasma deposition system are that the system is operative at 13.56 megahertz and into the system is introduced mixtures of silane, nitrogen, and ammonia. Nominal conditions during the plasma deposition of silicon nitride are: a pressure of 0.65 torr with: a first flow at a rate of 220 SCCM of a 5% silane and 95% nitrogen mixed vapor flow; a second flow at a rate of 23.0 SCCM ammonia vapor flow; and a third flow at a rate of 200 SCCM of a pure nitrogen vapor flow. A typical deposition temperature for the plasma system is 250° C. at a deposition power of 35 watts. Generally, 2,000 Å (i.e. 200 nanometers) is the thickness of the deposited layer 36. The silicon nitride, as deposited, is moderately compressively stress at approximately $1 \times 10^9$ dynes/cm$^2$.

Figure 4A:
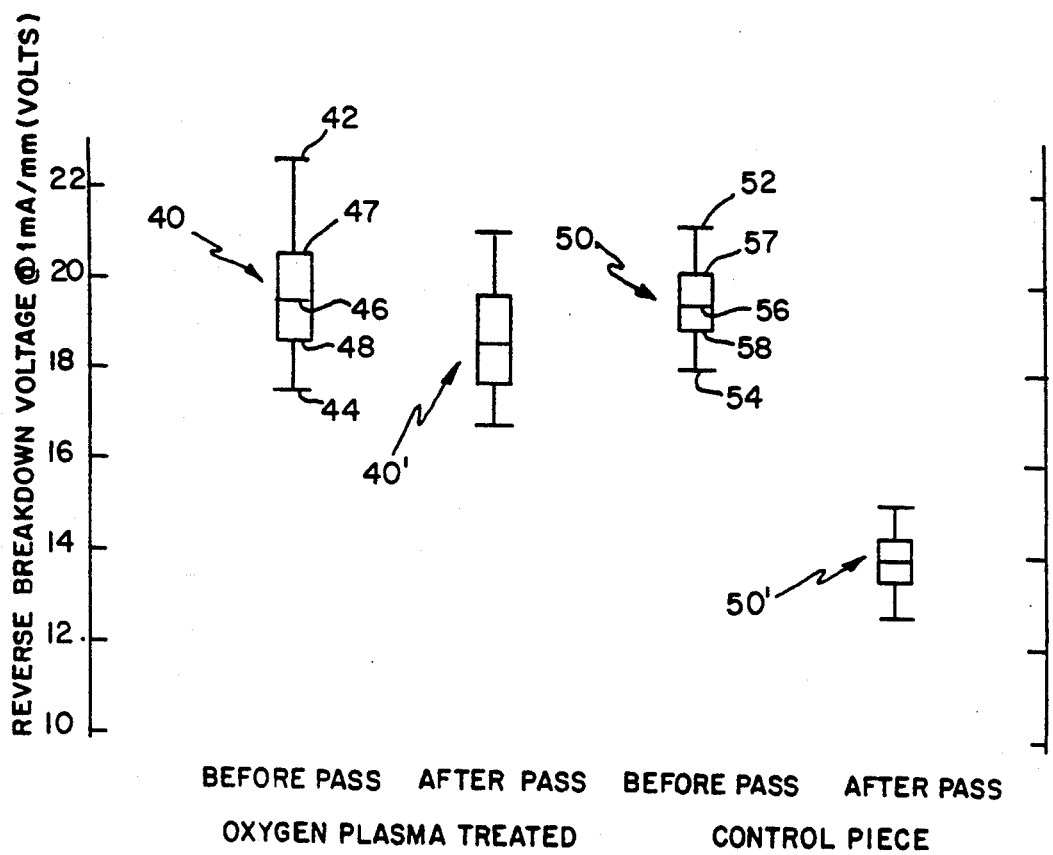
FIG. 4A is a plot of reverse breakdown voltage (in volts) versus lot numbers prior to and subsequent to a surface treatment showing statistics of breakdown voltage measured for individual devices in each one of the lots.
Figure 4B:
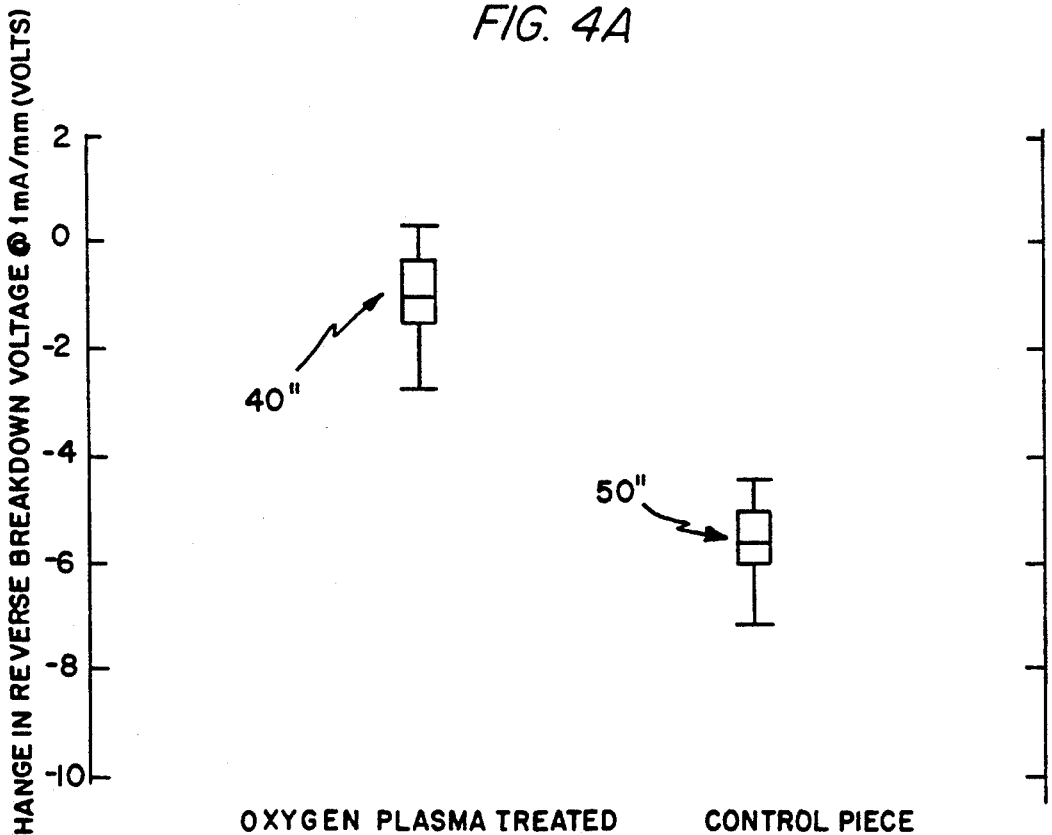
FIG. 4B is a plot of the change in a device by device basis in reverse breakdown voltage versus transistor lot number for the treated and control devices after passivation.

Referring now to FIGS. 4, 4A, and 4B, reverse breakdown voltage set statistics 40, 50 for the drain to gate junction measured at a one milliamp per millimeter channel current density are shown for two sets of field effect transistors before passivation and after passivation. For example, using set statistics 40 as an example, the plot shows the highest value 42 of reverse breakdown voltage, the lowest value 44, the median 46, and upper and lower quartiles 47, 48, respectively, provided in a set of field effect transistors here prior to passivation and surface treatment. The first set 40 shows a range of breakdown voltages for FETs in the set between approximately 17.5 volts to 22.5 volts prior to passivation. A statistics set 50 of a control set of FETs fabricated from the same wafer as the "to be treated" FET set 40 shows a breakdown voltage characteristic between approximately 18 and 21.7 volts. The wafer was washed in an ammonium hydroxide (NH$_3$OH) solution prior to O$_2$ plasma and passivation of the FETs used to obtain the data in set statistics 40, and prior to passivation without O$_2$ plasma treatment for the FETs used to obtain the data in set statistics 50. After washing in NH$_3$OH, ellipsometer measurements were 165.3° which implies a surface containing residual oxide of about 10 Å in thickness. FET set 42 was treated with the O$_2$ plasma in a barrel plasma reactor for 35 minutes providing an oxide containing layer of approximately 30 Å in thickness. The ellipsometer phase angle Δ was 159°. After passivation with 2,000 Å of silicon nitride, set statistics 40' of the oxygen plasma treated devices show a breakdown voltage characteristic between approximately 17 volts and 21 volts. The set statistics 50' shows the characteristics of the control FETs which were also washed in NH$_3$OH as mentioned above and then passivated with 2,000 Å of Si$_2$N$_3$, but without receiving the O$_2$ plasma treatment. The set statistics 50' of the control FETs after passivation show a much lower reverse breakdown voltage characteristic range between approximately 12.5 volts and 15 volts. The differences in two breakdown voltage ranges are depicted in FIG. 4B which shows a range of change in reverse breakdown voltage on a device by device basis as measured prior to and after passivation. The O$_2$ plasma treated FETs had a range of change of set statistics 40'' in reverse breakdown voltage from approximately +0.5 volts to −2.5 volts. The control FETs which did not receive the oxygen plasma treatment, had a range of change in set statistics 50'' of the reverse breakdown voltage characteristics of at least −4.5 to −7 volts. Thus, by comparison of FIGS. 4A and 4B and, in particular, FIG. 4B, it is shown that the oxygen plasma treatment increases the breakdown voltage after passivation by at least on average about 4 volts over what such characteristic would be without the treatment.

Although use of O$_2$ as the electro-negative species has been principally described, other electro-negative species would also be suitable. For example, fluorine electronegativity ($e_n$)=4.0 is even more electro-negative than O$_2$ (en=3.5) and would be a suitable alternative species. For gallium arsenide, arsenic has the higher electro-negativity ($e_2$=2.0) of the two. Thus, any suitable species with an electro-negative of $e_n > 2.0$ should provide some improvement. Carbon with an electro-negative of $e_n=2.5$ is another alternative. In GaAs carbon is a shallow donor dopant. This would need to be taken into consideration however when specifying doping concentration of the channel layer.

Other examples of species beside those mentioned above include chlorine (Cl) $e_n=3.0$, sulfur $e_n=2.5$ and nitrogen (N) $e_n=3.0$.

Having described preferred embodiments of the invention, it will now become apparent to one of skill in the art that other embodiments incorporating their concepts may be used. It is felt, therefore, that these embodiments should not be limited to disclosed embodiments but rather should be limited only by the spirit and scope of the appended claims.

What is claimed is:

1. A method of preparing a Group III-V semiconductor surface to receive a passivation layer comprises the steps of:

disposing a substrate of the Group III-V semiconductor material in a plasma containing an electro-negative species, said substrate self-biased at a potential of greater than zero volts between the plasma and a surface of said substrate to introduce said electronegative species into a surface portion of said semiconductor substrate; and depositing said passivation layer comprised of any non Group III-V semiconductor oxide over said surface portion of the semiconductor substrate containing the electronegative species.

2. The method, as recited in claim 1, wherein during said disposing step the self bias between said plasma and semiconductor substrate is between 50 and 80 volts, with the substrate being negative with respect to the plasma.

3. The method of claim 2 wherein said electronegative species is selected from the group consisting of oxygen, fluorine, nitrogen, chlorine, and sulphur.

4. The method of claim 2 wherein said electronegative species is selected from the group consisting of oxygen and fluorine.

5. The method of claim 4 wherein said passivation layer is selected from the group consisting of silicon nitride, silicon dioxide, silicon monoxide, silicon oxynitride, and polymides.

6. The method, as recited in claim 4, wherein said passivation layer is silicon nitride and said Group III-V material is GaAs.

7. A method of preparing a Group III-V semiconductor surface to receive a passivation layer comprises the steps of:

disposing a substrate of the Group III-V semiconductor material in a plasma containing an electronegative species selected from the group consisting of fluorine, nitrogen, chlorine, and sulphur, said substrate self-biased at a potential of greater than zero volts between the plasma and a surface of said substrate to introduce said electro-negative species into a surface portion of said semiconductor substrate; and depositing said passivation layer over said surface portion of the semiconductor substrate containing the electro-negative species.

8. The method of claim 7 wherein said Group III-V material is GaAs.

9. The method of claim 7 wherein said electro-negative species is fluorine.

10. The method of claim 9 wherein said Group III-V material is GaAs.

11. A method of preparing a metal semiconductor field effect transistor having a semiconductor surface to receive a passivation layer comprises the steps of:

providing a substrate supporting an active layer of a Group III-V material having a dopant concentration, with source and drain electrodes disposed over said active layer and with a gate electrode disposed between said source and drain electrodes in Schottky barrier contact to said active layer, with said active layer having a semiconductor surface exposed between at least said gate electrode and drain electrode;

disposing the exposed semiconductor surface in a plasma containing an electro-negative species with a self bias potential of greater than zero volts between the plasma and the surface to provide a surface layer portion of said exposed surface of said Group III-V material containing the electro-negative species; and depositing said passivation layer over said surface layer portion of the semiconductor and electronegative species.

12. The method, as recited in claim 11, wherein during said disposing step the self bias between said plasma and semiconductor substrate is between 50 and 80 volts, with the substrate being negative with respect to the plasma.

13. The method of claim 12 wherein said electronegative species is selected from the group consisting of oxygen, fluorine, nitrogen, chlorine, and sulphur.

14. The method of claim 12 wherein said electronegative species is selected from the group consisting of oxygen and fluorine.

15. The method, of claim 14, wherein said passivation layer is selected from the group consisting of silicon nitride, silicon dioxide, silicon monoxide, silicon oxynitride, and polymides.

16. The method, as recited in claim 14, wherein said passivation layer is silicon nitride.

17. The method of claim 15 wherein said Group III-V material is gallium arsenide.

18. The method of claim 13 wherein said Group III-V material is GaAs.

19. The method of claim 17, wherein said passivation layer is selected from the group consisting of silicon nitride, silicon dioxide, silicon monoxide, silicon oxynitride and polyimides.

20. The method of claim 19, wherein said passivation layer is silicon nitride.

21. A method of preparing a metal semiconductor field effect transistor having a semiconductor surface to receive a passivation layer comprises the steps of:

providing a substrate supporting an active layer of a Group III-V material having a dopant, source and drain electrodes disposed in ohmic contact over said active layer, a gate electrode disposed in Schottky barrier contact to said active layer and between said source and drain electrodes, with said active layer having a semiconductor oxide surface exposed between at least said gate electrode and drain electrode;

removing said semiconductor oxide surface between the at least said gate electrode and drain electrode;

disposing the exposed semiconductor surface in a plasma containing an electro-negative species with a selfbias potential of greater than zero volts between the plasma and the surface to provide a surface layer portion of said exposed surface of said Group III-V material containing the electro-negative species; and depositing said passivation layer over said surface layer portion of the semiconductor and electronegative species.

* * * * *